(12) United States Patent
Bjelopavlic et al.

(10) Patent No.: US 12,074,020 B2
(45) Date of Patent: Aug. 27, 2024

(54) ETCHING COMPOSITIONS

(71) Applicant: Fujifilm Electronic Materials U.S.A., Inc., N. Kingstown, RI (US)

(72) Inventors: Mick Bjelopavlic, Chandler, AZ (US); Carl Ballesteros, San Tan Valley, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 79 days.

(21) Appl. No.: 17/960,895

(22) Filed: Oct. 6, 2022

(65) Prior Publication Data
US 2023/0112795 A1 Apr. 13, 2023

Related U.S. Application Data

(60) Provisional application No. 63/254,625, filed on Oct. 12, 2021.

(51) Int. Cl.
*H01L 21/02* (2006.01)
*H01L 21/306* (2006.01)

(52) U.S. Cl.
CPC .. *H01L 21/02019* (2013.01); *H01L 21/30604* (2013.01)

(58) Field of Classification Search
None
See application file for complete search history.

(56) References Cited

U.S. PATENT DOCUMENTS

| | | | |
|---|---|---|---|
| 6,717,019 B2 | 4/2004 | Lassila | |
| 10,920,144 B2 | 2/2021 | Bjelopavlic et al. | |
| 11,124,704 B2 | 9/2021 | Bjelopavlic et al. | |
| 11,820,929 B2* | 11/2023 | Bjelopavlic | H01L 21/02019 |
| 11,912,921 B2* | 2/2024 | Bjelopavlic | C09K 13/10 |
| 2003/0158059 A1* | 8/2003 | Sakai | C11D 7/265 |
| | | | 257/E21.228 |
| 2016/0083650 A1 | 3/2016 | Sugishima et al. | |
| 2019/0119571 A1* | 4/2019 | Mizutani | C09K 13/06 |
| 2020/0172808 A1 | 6/2020 | Bjelopavlic et al. | |
| 2020/0211856 A1 | 7/2020 | Wada et al. | |
| 2021/0087467 A1 | 3/2021 | Mizutani | |
| 2021/0371748 A1 | 12/2021 | Bjelopavlic et al. | |
| 2022/0081616 A1* | 3/2022 | Bjelopavlic | C09K 13/08 |
| 2023/0313041 A1* | 10/2023 | Dinega | C09K 13/06 |
| | | | 438/753 |

OTHER PUBLICATIONS

International Search Report and Written Opinion in International Appln. No. PCT/US2022/045845, mailed on Feb. 1, 2023, 15 pages.
Serry et al., "Silicon Germanium As a Novel Mask for Silicon Deep Reactive Ion Etching," Journal of Microelectromechanical Systems, Oct. 5, 2013, 8 pages.

* cited by examiner

*Primary Examiner* — Allan W. Olsen
(74) *Attorney, Agent, or Firm* — Fish & Richardson P.C.

(57) ABSTRACT

The present disclosure is directed to etching compositions that are useful for, e.g., selectively removing silicon germanium (SiGe) from a semiconductor substrate as an intermediate step in a multistep semiconductor manufacturing process.

37 Claims, No Drawings

ETCHING COMPOSITIONS

CROSS-REFERENCE TO RELATED APPLICATION

The present application claims priority to U.S. Provisional Application Ser. No. 63/254,625, filed on Oct. 12, 2021, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch silicon germanium in the presence of other exposed or underlying materials, such as metal conductors (e.g., copper), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Silicon germanium (SiGe) can be utilized in the manufacturing of semiconductor devices, liquid crystal displays, MEMS (Micro Electro Mechanical Systems), printed wiring boards and the like, as nanowires and/or nanosheets. For example, it can be used as a gate material in a multigate device, such as a multiple-gate field-effect transistor (FET) (e.g., a gate-all-around FET).

SUMMARY OF THE DISCLOSURE

In the construction of semiconductor devices, silicon germanium (SiGe) frequently needs to be etched. In the various types of uses and device environments of SiGe, other layers are in contact with or otherwise exposed at the same time as this material is etched. Highly selective etching of the SiGe in the presence of these other materials (e.g. metal conductors, dielectric, and hard masks) is typically needed for device yield and long life. The etching process for the SiGe may be a plasma etching process. However, using a plasma etching process on the SiGe layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at a significant cost.

The present disclosure relates to compositions and processes for selectively etching SiGe relative to hard mask layers, gate materials (e.g., SiN, poly-Si, or SiOx), electrical conductive materials (e.g., SiGe doped with boron), and low-k dielectric layers (e.g., SiN, poly-Si, SiOx, carbon doped oxide, or SiCO) that are present in the semiconductor device. More specifically, the present disclosure relates to compositions and processes for selectively etching SiGe relative to SiGe doped with boron or low-k dielectric layers.

In one aspect, this disclosure features an etching composition that includes a) at least one fluorine-containing acid, the at least one fluorine-containing acid including hydrofluoric acid or hexafluorosilicic acid; b) at least one oxidizing agent; c) at least one organic acid or an anhydride thereof, the at least one organic acid including formic acid, acetic acid, propionic acid, or butyric acid; d) at least one polymerized naphthalene sulfonic acid; e) at least one hexafluorosilicate salt; (f) at least one amine, the at least one amine including an amine of formula (I): N—$R_1R_2R_3$, in which $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and g) water.

In another aspect, this disclosure features a method that includes contacting a semiconductor substrate containing a SiGe film with an etching composition described herein to substantially remove the SiGe film.

In another aspect, this disclosure features a method that includes contacting a semiconductor substrate containing a SiGe film and a film containing SiGe doped with boron with an etching composition to substantially remove the SiGe film, in which the etching composition includes a) at least one fluorine-containing acid, the at least one fluorine-containing acid including hydrofluoric acid or hexafluorosilicic acid; b) at least one oxidizing agent; c) at least one organic acid or an anhydride thereof, the at least one organic acid including formic acid, acetic acid, propionic acid, or butyric acid; d) at least one polymerized naphthalene sulfonic acid; e) at least one inorganic acid different from the at least one fluorine-containing acid; (f) at least one amine, the at least one amine including an amine of formula (I): N—$R_1R_2R_3$, in which $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and g) water.

In still another aspect, the disclosure features an article formed by a method described herein, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In general, the disclosure features an etching composition (e.g., an etching composition for selectively removing SiGe) that includes a) at least one fluorine-containing acid, the at least one fluorine-containing acid including hydrofluoric acid (HF) or hexafluorosilicic acid ($H_2SiF_6$); b) at least one oxidizing agent, the at least one oxidizing agent including hydrogen peroxide; c) at least one organic acid or an anhydride thereof, the at least one organic acid including formic acid, acetic acid, propionic acid, or butyric acid; d)

at least one polymerized naphthalene sulfonic acid; e) at least one amine, the at least one amine including an amine of formula (I): N—$R_1R_2R_3$, in which $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and f) water.

In general, the etching composition of this disclosure can include at least one (e.g., two, three, or four) fluorine-containing acid. The fluorine-containing acid described herein can be an inorganic acid, such as HF or $H_2SiF_6$. In some embodiments, the at least one fluorine-containing acid is in an amount of at least about 0.05 wt % (e.g., at least about 0.06 wt %, at least about 0.07 wt %, at least about 0.08 wt %, at least about 0.09 wt %, at least about 0.1 wt %, at least about 0.15 wt %, at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) to at most about 2 wt % (e.g., at most about 1.9 wt %, at most about 1.8 wt %, at most about 1.7 wt %, at most about 1.6 wt %, at most about 1.5 wt %, at most about 1.2 wt %, at most about 1 wt %, at most about 0.5 wt %, at most about 0.4 wt %, or at most about 0.2 wt %) of the etching composition of this disclosure. Without wishing to be bound by theory, it is believed that fluorine-containing acid can facilitate and enhance the removal of SiGe on a semiconductor substrate during the etching process.

In some embodiments, the etching composition of this disclosure can optionally include at least one (e.g., two, three, or four) salt of a fluorine-containing acid (e.g., in addition to the fluorine-containing acid described above). For example, the salt can be a fluoride salt (e.g., ammonium fluoride) or a hexafluorosilicate salt. Examples of hexafluorosilicate salts include ammonium hexafluorosilicate (($NH_4$)$_2SiF_6$) or tetraalkylammonium hexafluorosilicates (e.g., those include $C_1$-$C_6$ alkyl groups). Examples of tetraalkylammonium hexafluorosilicates include tetramethylammonium hexafluorosilicate, tetraethylammonium hexafluorosilicate, tetrapropylammonium hexafluorosilicates (e.g., tetra(n-propyl)ammonium hexafluorosilicate or tetraisopropylammonium hexafluorosilicate), and tetrabutylammonium hexafluorosilicates (e.g., tetra(n-butyl)ammonium hexafluorosilicate, tetraisobutylammonium hexafluorosilicate, and tetra(t-butyl)ammonium hexafluorosilicate).

In some embodiments, the salt of a fluorine-containing acid can be in an amount of at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.12 wt %, at least about 0.14 wt %, or at least about 0.15 wt %) to at most about 1 wt % (e.g., at most about 0.9 wt %, at most about 0.8 wt %, at most about 0.7 wt %, at most about 0.6 wt %, at most about 0.5 wt %, at most about 0.4 wt %, at most about 0.3 wt %, at most about 0.2 wt %, or at most about 0.15%) of the etching composition of this disclosure. Without wishing to be bound by theory, it is believed that the salt of a fluorine-containing acid can reduce the etching or removal of Si on a semiconductor substrate during the etching process.

The etching composition of this disclosure can include at least one (e.g., two, three, or four) oxidizing agent suitable for use in microelectronic applications. Examples of suitable oxidizing agents include, but are not limited to, oxidizing acids or salts thereof (e.g., nitric acid, permanganic acid, or potassium permanganate), peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, peroxycarboxylic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate)), and periodic acid and salts thereof (e.g., periodic acid, ammonium periodate, or tetramethylammonium periodate). These oxidizing agents can be used singly or in combination.

In some embodiments, the at least one oxidizing agent can be from at least about 5 wt % (e.g., at least about 6 wt %, at least about 7 wt %, at least about 8 wt %, at least about 9 wt %, at least about 10 wt %, at least about 11 wt %, at least about 13 wt %, or at least about 15 wt %) to at most about 20 wt % (e.g., at most about 18 wt %, at most about 16 wt %, at most about 15 wt %, at most about 14 wt %, at most about 12 wt %, or at most about 10 wt %) of the etching composition of this disclosure. Without wishing to be bound by theory, it is believed that the oxidizing agent can facilitate and enhance the removal of SiGe on a semiconductor substrate.

In general, the etching composition of this disclosure can include at least one (e.g., two, three, or four) organic acid or an anhydride thereof. In some embodiments, the organic acid can be formic acid, acetic acid, propionic acid, or butyric acid. In some embodiments, the organic acid anhydride can be formic anhydride, acetic anhydride, propionic anhydride, or butyric anhydride. In some embodiments, the at least one organic acid or an anhydride thereof (individually or in combination) can be from at least about 30 wt % (e.g., at least about 35 wt %, at least about 40 wt %, at least about 45 wt %, at least about 50 wt %, at least about 55 wt %, or at least about 60 wt %) to at most about 90 wt % (e.g., at most about 85 wt %, at most about 80 wt %, at most about 75 wt %, at most about 70 wt %, at most about 65 wt %, at most about 60 wt %, at most about 55 wt %, at most about 50 wt %, at most about 45 wt %, or at most about 40 wt %) of the etching composition of this disclosure. Without wishing to be bound by theory, it is believed that the organic acid or an anhydride thereof can facilitate and enhance the removal of SiGe on a semiconductor substrate.

The etching composition of this disclosure can generally include at least one polymerized naphthalene sulfonic acid (or poly(naphthalene sulfonic acid)), e.g., as a surfactant or selective inhibitor. In some embodiments, the polymerized naphthalene sulfonic acid can be a sulfonic acid having the following chemical structure:

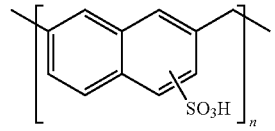

in which n is 3, 4, 5, or 6. Commercially available examples of such the polymerized naphthalene sulfonic acids include Takesurf A-47 series products available from Takemoto Oil & Fat Co., Ltd. In some embodiments, the at least one polymerized naphthalene sulfonic acid can be from at least about 0.005 wt % (e.g., at least about 0.006 wt %, at least about 0.007 wt %, at least about 0.008 wt %, at least about 0.009 wt %, at least about 0.01 wt %, at least about 0.02 wt %, at least about 0.03 wt %, at least about 0.04 wt %, at least about 0.05 wt %, or at least about 0.1 wt %) to at most about 0.15 wt % (e.g., at most about 0.14 wt %, at most about 0.12 wt %, at most about 0.1 wt %, at most about 0.08 wt %, at most about 0.06 wt %, at most about 0.05 wt %, at most about 0.04 wt %, or at most about 0.02 wt %) of the etching composition of this disclosure. Without wishing to be bound by theory, it is believed that the polymerized naphthalene sulfonic acid can selectively inhibit the removal of SiN, poly-Si, and SiCO when SiGe is removed from a semiconductor substrate using the etching composition of this disclosure.

In general, the etching composition of this disclosure can include at least one (e.g., two, three, or four) amine. In some embodiments, the amine can be an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH. Examples of suitable amines of formula (I) include diisopropylamine, N-butyldiethanolamine, N-(3-aminopropyl)-diethanolamine, N-octylglucamine, N-ethylglucamine, N-methylglucamine, and 1-[bis(2-hydroxyethyl)amino]-2-propanol.

In some embodiments, the at least one amine can be from at least about 0.001 wt % (e.g., at least about 0.002 wt %, at least about 0.004 wt %, at least about 0.005 wt %, at least about 0.006 wt %, at least about 0.008 wt %, at least about 0.01 wt %, at least about 0.02 wt %, at least about 0.05 wt %, or at least about 0.1 wt %) to at most about 0.15 wt % (e.g., at most about 0.14 wt %, at most about 0.12 wt %, at most about 0.1 wt %, at most about 0.08 wt %, at most about 0.06 wt %, at most about 0.05 wt %, at most about 0.04 wt %, or at most about 0.02 wt %) of the etching composition of this disclosure. Without wishing to be bound by theory, it is believed that the amine can selectively inhibit the removal of SiN, poly-Si, and SiCO when SiGe is removed from a semiconductor substrate using the etching composition of this disclosure.

In general, the etching composition of this disclosure can include water as a solvent. In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 10 wt % (e.g., at least about 12 wt %, at least about 14 wt %, at least about 15 wt %, at least about 16 wt %, at least about 18 wt %, at least about 20 wt %, at least about 25 wt %, at least about 30 wt %, at least about 35 wt %, at least about 40 wt %, at least about 45 wt %, at least about 50 wt %, at least about 55 wt %, or at least about 60 wt %) to at most about 75 wt % (e.g., at most about 70 wt %, at most about 65 wt %, at most about 60 wt %, at most about 55 wt %, at most about 50 wt %, at most about 45 wt %, at most about 40 wt %, at most about 35 wt %, at most about 30 wt %, at most about 25 wt %, or at most about 20 wt %,) of the etching composition. Without wishing to be bound by theory, it is believed that, if the amount of water is greater than 75 wt % of the composition, it would adversely impact the SiGe etch rate, and reduce its removal during the etching process. On the other hand, without wishing to be bound by theory, it is believed that the etching composition of this disclosure should include a certain level of water (e.g., at least about 10 wt %) to keep all other components solubilized and to avoid reduction in the etching performance.

In some embodiments, the etching composition of this disclosure can further include at least one (e.g., two, three, or four) organic solvent. In some embodiments, the at least one organic solvent can include an alcohol or an alkylene glycol ether. Examples of suitable organic solvents include propylene glycol, hexylene glycol, 1,3-propanediol, ethylene glycol butyl ether, and 3-methoxy-3-methyl-1-butanol. In some embodiments, the at least one organic solvent can be from at least about 10 wt % (e.g., at least about 15 wt %, at least about 20 wt %, at least about 25 wt %, at least about 30 wt %, or at least about 35 wt %) to at most about 40 wt % (e.g., at most about 35 wt %, at most about 30 wt %, at most about 25 wt %, at most about 20 wt %, or at most about 15 wt %) of the etching composition.

In some embodiments, the etching composition of this disclosure can further include at least one (e.g., two, three, or four) sugar alcohol (e.g., mannitol or sorbitol). In some embodiments, the at least one sugar alcohol can be from at least about 0.001 wt % (e.g., at least about 0.002 wt %, at least about 0.005 wt %, at least about 0.01 wt %, at least about 0.02 wt %, or at least about 0.05 wt %) to at most about 0.1 wt % (e.g., at most about 0.08 wt %, at most about 0.06 wt %, at most about 0.05 wt %, at most about 0.04 wt %, at most about 0.02 wt %, or at most about 0.01 wt %) of the etching composition. Without wishing to be bound by theory, it is believed that including a sugar alcohol in the etching composition of this disclosure can inhibit the poly-silicon etch rate.

In some embodiments, the etching composition of this disclosure can further include at least one (e.g., two, three, or four) boronic acid. For example, the boronic acid can be of the following formula: R—$B(OH)_2$, in which R is $C_1$-$C_{10}$ alkyl, aryl, or heteroaryl where aryl or heteroaryl can be optionally substituted by one to six (e.g., 1, 2, 3, 4, 5, or 6) $C_1$-$C_{10}$ alkyl. Examples of suitable boronic acids include phenyl boronic acid and naphthalene-1-boronic acid.

In some embodiments, the at least one boronic acid can be from at least about 0.01 wt % (e.g., at least about 0.02 wt %, at least about 0.03 wt %, at least about 0.04 wt %, at least about 0.05 wt %, at least about 0.1 wt %, at least about 0.2 wt %, or at least about 0.3 wt %) to at most about 0.5 wt % (e.g., at most about 0.4 wt %, at most about 0.3 wt %, at most about 0.2 wt %, at most about 0.1 wt %, at most about 0.08 wt %, or at most about 0.05 wt %) of the etching composition. Without wishing to be bound by theory, it is believed that including a boronic acid in the etching composition of this disclosure can inhibit the SiOx etch rate.

In some embodiments, the etching composition of this disclosure can further include at least one (e.g., two, three, or four) an inorganic acid (e.g., a mineral acid). Examples of suitable inorganic acids include sulfuric acid and boric acid. In general, the inorganic acid described herein is not a boronic acid as a boronic acid is generally considered as an organic acid.

In some embodiments, the at least one inorganic acid can be from at least about 0.1 wt % (e.g., at least about 0.2 wt %, at least about 0.3 wt %, at least about 0.4 wt %, at least about 0.5 wt %, at least about 0.6 wt %, at least about 0.7 wt %, at least about 0.8 wt %, at least about 0.9 wt %, at least about 1 wt %, at least about 2 wt %, or at least about 3 wt %) to at most about 5 wt % (e.g., at most about 4.5 wt %, at most about 4 wt %, at most about 3.5 wt %, at most about 3 wt %, at most about 2.5 wt %, at most about 2 wt %, at most about 1.5 wt %, or at most about 1 wt %) of the etching composition.

In some embodiments, the etching composition of this disclosure can have a pH of at least about 1 (e.g., at least about 1.2, at least about 1.4, at least about 1.5, at least about 1.6, at least about 1.8, at least about 2, at least about 2.2, at least about 2.4, or at least about 2.5) and/or at most about 3

(e.g., at most about 2.8, at most about 2.6, at most about 2.5, at most about 2.4, at most about 2.2, at most about 2, or at most about 1.5). Without wishing to be bound by theory, it is believed that an etching composition having a pH higher than 3 would not have sufficient SiGe selectivity relative to low-k dielectric materials (e.g., SiOx) as such an etching composition may have a significantly increased low-k dielectric material etch rate. Further, it is believed that an etching composition having a pH lower than 1 could decompose certain components in the composition due to strong acidity.

In addition, in some embodiments, the etching composition of the present disclosure may contain additives such as, pH adjusting agents, corrosion inhibitors, surfactants, additional organic solvents, biocides, and defoaming agents as optional components. Examples of suitable additives include alcohols (e.g., polyvinyl alcohol), and organic acids (e.g., iminidiacetic acid, malonic acid, oxalic acid, succinic acid, and malic acid). Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

In general, the etching composition of the present disclosure can have a relatively high SiGe/dielectric material (e.g., SiN, polysilicon, or SiCO) etch selectivity (i.e., a high ratio of SiGe etch rate over dielectric material etch rate when the etch rates are measured under the same conditions). In some embodiments, the etching composition can have a SiGe/dielectric material etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching composition of the present disclosure can have a relatively low etch rate for removing a film containing SiGe doped with boron (i.e., SiGe:B). For example, the etching composition can have a SiGe:B etch rate of from at most about 3 Å/min (e.g., at most about 2.5 Å/min, at most about 2 Å/min, at most about 1.5 Å/min, at most about 1 Å/min, or at most about 0.5 Å/min) to 0 Å/min at 25° C.

In some embodiments, the etching compositions of the present disclosure can specifically exclude one or more of the additive components, in any combination, if more than one. Such components are selected from the group consisting of organic solvents, pH adjusting agents, polymers, oxygen scavengers, quaternary ammonium compounds (including quaternary ammonium hydroxides (such as TMAH) and salts), amines, alkaline bases (such as NaOH, KOH, and LiOH), surfactants other than a defoamer, a defoamer, fluorine containing compounds (e.g., fluoride compounds or fluorinated compounds (e.g., polymers/surfactants)), abrasives (e.g., silica/ceria abrasives, non-ionic abrasives, surface modified abrasives, or negatively/positively charged abrasives), silicon containing compounds (e.g., silicates or silanes (e.g., alkoxysilanes)), surfactants (e.g., cationic surfactants, anionic surfactants, or non-ionic surfactants), plasticizers, hydroxycarboxylic acids (e.g., those containing more than two hydroxyl groups), carboxylic and polycarboxylic acids lacking amino groups, cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, and metal salts (e.g., metal halides).

The etching composition of this disclosure can be prepared by simply mixing the components together, or can be prepared by blending two compositions in a kit. The first composition in the kit can be an aqueous solution of an oxidizing agent (e.g., $H_2O_2$). The second composition in the kit can contain the remaining components of the etching composition of this disclosure at predetermined ratios in a concentrated form such that the blending of the two compositions will yield a desired etching composition of the disclosure.

In some embodiments, the present disclosure features a method of etching a semiconductor substrate containing at least one SiGe film. The method can include contacting a semiconductor substrate containing the at least one SiGe film with an etching composition of this disclosure to remove the SiGe film. The method can further include rinsing the semiconductor substrate with a rinse solvent after the contacting step and/or drying the semiconductor substrate after the rinsing step. In some embodiments, the method does not substantially remove a metal conductor (e.g., Cu) or a dielectric material (e.g., SiN, polysilicon, or SiCO) in the semiconductor substrate. For example, the method does not remove more than about 5% by weight (e.g., more than about 3% by weight or more than about 1% by weight) of a metal conductor or a dielectric material in the semiconductor substrate.

In some embodiments, the SiGe film in a semiconductor substrate can include at least about 10 wt % (e.g., at least about 12 wt %, at least about 14 wt %, at least about 15 wt %, at least about 16 wt %, at least about 18 wt %, or at least about 20 wt %) and/or at most about 35 wt % (e.g., at most about 34 wt %, at most about 32 wt %, at most about 30 wt %, at most about 28 wt %, at most about 26 wt %, at most about 25 wt %, at most about 24 wt %, at most about 22 wt %, at most about 20 wt %, at most about 18 wt %, at most about 16 wt %, or at most about 15 wt %) Ge in the SiGe film. Without wishing to be bound by theory, it is believed that a SiGe film containing from about 10 wt % to about 35 wt % Ge can be more easily removed from a semiconductor substrate by an etching composition compared to a film containing more than 35 wt % or less than 10 wt % Ge.

In some embodiments, the etching method includes the steps of:
(A) providing a semiconductor substrate containing a SiGe film;
(B) contacting the semiconductor substrate with an etching composition described herein;
(C) rinsing the semiconductor substrate with one or more suitable rinse solvents; and
(D) optionally, drying the semiconductor substrate (e.g., by any suitable means that removes the rinse solvent and does not compromise the integrity of the semiconductor substrate).

In some embodiments, the present disclosure also features a method of etching a semiconductor substrate containing a SiGe film and a film containing SiGe doped with boron. The method can include contacting a semiconductor substrate with an etching composition of this disclosure to remove the SiGe film. In some embodiments, the method does not substantially remove the film containing SiGe doped with boron.

The semiconductor substrates containing SiGe to be etched in this method can contain organic and organometallic residues, and a range of metal oxides, some or all of which may also be removed during the etching process.

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, polysilicon, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of SiGe increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 250 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×1.0" test coupons for evaluation. Primary blanket film materials used for testing include 1) a SiGe film having a thickness of about 500 Å deposited on a silicon substrate; 2) a SiN film having a thickness of about 600 Å deposited on a silicon substrate, 3) a polysilicon film having a thickness of about 1000 Å deposited on a silicon substrate; 4) a SiCO film having a thickness of about 200 Å deposited on a silicon substrate, 5) a SiOx film having a thickness of about 1200 Å deposited on a silicon substrate, and 6) a SiGe film doped with boron having a thickness of about 250 Å deposited on a silicon substrate.

The blanket film test coupons were measured for pre-treatment and post-treatment thickness to determine blanket film etch rates. For the SiGe, SiOx, and polysilicon blanket films, the film thicknesses were measured pre-treatment and post-treatment by Ellipsometry using a Woollam VASE.

General Procedure 3

Etching Evaluation with Beaker Test

All blanket film etch testing was carried out in a temperature controlled water batch (25° C.) in a 125 mL PFA bottle containing 100 g of a sample solution with continuous stirring at 250 rpm, with PFA screw in place at all times to minimize evaporative losses. All blanket test coupons having a blanket dielectric film exposed on one side to the sample solution were diced by diamond scribe into 0.5"×1.0" square test coupon size for beaker scale testing. Each individual test coupon was held into position using a single 4" long, locking plastic tweezers clip. The test coupon, held on one edge by the locking tweezers clip, was suspended into the 125 mL PFA bottle and immersed into the 100 g test solution while the solution was stirred continuously at 250 rpm at 25° C. The test coupons were held static in the stirred solution until the treatment time (as described in General Procedure 3A) had elapsed. After the treatment time in the test solution had elapsed, the sample coupons were immediately removed from the 125 mL PFA bottle and rinsed according to General Procedure 3A. After the final IPA rinse step, all test coupons were subject to a filtered nitrogen gas blow off step using a hand held nitrogen gas blower which forcefully removed all traces of IPA to produce a final dry sample for test measurements.

General Procedure 3A Blanket Test Coupons

Immediately after a treatment time of 2 to 10 minutes according to General Procedure 3, the coupon was immersed in a 300 mL volume of ultra-high purity deionized (DI) water for 15 seconds with mild agitation, which was followed by 300 mL of isopropyl alcohol (IPA) for 15 seconds with mild agitation, and a final rinse in 300 mL of IPA for 15 seconds with mild agitation. The processing was completed according to General Procedure 3.

Example 1

Formulation Examples 1-8 (FE-1 to FE-8) were prepared according to General Procedure 1, and evaluated according to General Procedures 2, 3, and 3A. Specifically, for each tested substrate, the etching test was performed for two minutes at 25° C. while the etching composition was stirred at 250 rpm. The formulations and the test results are summarized in Table 1 below.

TABLE 1

| Composition [wt %] | FE-1 | FE-2 | FE-3 |
| --- | --- | --- | --- |
| Hydrofluoric acid | 0.2% | 0.065% | 0.105% |
| Hydrogen Peroxide | 8.5% | 7.05% | 7.05% |
| Acetic acid | 69.24% | 47.4% | 47.005% |
| Takesurf A-47Q | 0.01% | 0.01% | 0.01% |
| APDA | 0.01% | 0.01% | 0.01% |
| Sulfuric acid | 0.9% | 0.65% | 0.65% |
| Acetic anhydride | None | 27.50% | 27.5% |
| Phenylboronic acid | None | None | 0.05% |
| Water | 21.14% | 17.315% | 17.62% |
| Total | 100% | 100% | 100% |
| Test Results | | | |
| SiGe25 ER (Å/min) | 182.6 | 54.1 | 73.7 |
| SiGe:B ER (Å/min) | 45.7 | 1.8 | 0 |
| Poly-Si ER (Å/min) | 5.3 | 0 | 1 |
| SiCO ER (Å/min) | 2.4 | 0 | 0 |

TABLE 1-continued

| Composition [wt %] | FE-1 | FE-2 | FE-3 |
| --- | --- | --- | --- |
| SiOx ER (Å/min) | 19.7 | 1.3 | 2.9 |
| SiN ER (Å/min) | 0.6 | 0 | 0 |

APDA = N-(3-aminopropyl)-diethanolamine
SiGe25 = a SiGe film containing 25 wt % Ge
SiGe:B = a SiGe film doped with boron
ER = etch rate
N/A = Not available As shown in Table 1, FE-1 to FE-3 all exhibited relatively high SiGe25/SiGe:B, SiGe25/poly-Si, SiGe25/SiCO, SiGe25/SiOx, and SiGe25/SiN etch selectivity. In particular, FE-2 (which included acetic anhydride) surprisingly exhibited a significantly reduced SiGe:B etch rate compared to FE-1 (which did not include acetic anhydride). In addition, FE-3 (which included phenylboronic acid) surprisingly further reduced the SiGe:B etch rate compared to FE-2 (which did not include phenylboronic acid).

Example 2

Formulation Examples 4-6 (FE-4 to FE-6) were prepared according to General Procedure 1, and evaluated according to General Procedures 2, 3, and 3A. For each tested substrate, the etching test was performed at 24° C. while the etching composition was stirred at 250 rpm. The etch times were 60 seconds for SiGe 21, 10 minutes for SiOx, and 90 seconds for silicon. The formulations and test results are summarized in Table 2 below.

TABLE 2

| Composition [wt %] | FE-4 | FE-5 | FE-6 |
| --- | --- | --- | --- |
| Hydrofluoric acid | 0.2% | 0.2% | 0.2% |
| Hydrogen Peroxide | 8.5% | 8.5% | 8.5% |
| Acetic acid | 69.17% | 69.17% | 69.17% |
| Takesurf A-47Q | 0.01% | 0.01% | 0.01% |
| APDA | 0.01% | 0.01% | 0.01% |
| Sulfuric acid | 0.9% | 0.9% | 0.9% |
| Ammonium hexafluorosilicate | None | 0.073% | 0.146% |
| Water | 21.21% | 21.137% | 21.064 |
| Total | 100% | 100% | 100% |
| Test Results | | | |
| SiGe 21 crystal ER (Å/min) | 92.88 | 100.43 | 102.89 |
| SiOx ER (Å/min) | 17.61 | 19.17 | 18.1 |
| Si Loss (Å) | 1.65 | 0.62 | 0.58 |

As shown in Table 2, FE-4 to FE-6 all exhibited relatively high SiGe21/SiOx etch selectivity. On the other hand, FE-5 and FE-6 (which included ammonium hexafluorosilicate) surprisingly exhibited a significantly reduced Si loss compared to FE-4 (which did not include ammonium hexafluorosilicate).

While the invention has been described in detail with reference to certain embodiments thereof, it will be understood that modifications and variations are within the spirit and scope of that which is described and claimed.

What is claimed is:

1. An etching composition, comprising:
   at least one fluorine-containing acid, the at least one fluorine-containing acid comprising hydrofluoric acid or hexafluorosilicic acid;
   at least one oxidizing agent;

at least one organic acid or an anhydride thereof, the at least one organic acid comprising formic acid, acetic acid, propionic acid, or butyric acid;
at least one polymerized naphthalene sulfonic acid;
at least one hexafluorosilicate salt;
at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and
water.

2. The composition of claim 1, wherein the at least one polymerized naphthalene sulfonic acid comprises a sulfonic acid having a structure of

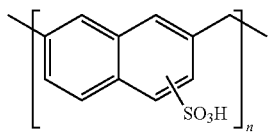

in which n is 3 to 6.

3. The composition of claim 1, wherein the at least one polymerized naphthalene sulfonic acid is in an amount of from about 0.005 wt % to about 0.15 wt % of the composition.

4. The composition of claim 1, wherein the amine of formula (I) is diisopropylamine, N-butyldiethanolamine, N-(3-aminopropyl)-diethanolamine, N-octylglucamine, N-ethylglucamine, N-methylglucamine, or 1-[bis(2-hydroxyethyl)amino]-2-propanol.

5. The composition of claim 4, wherein the at least one amine is in an amount of from about 0.001 wt % to about 0.15 wt % of the composition.

6. The composition of claim 1, wherein the at least one fluorine-containing acid is in an amount of from about 0.05 wt % to about 2 wt % of the composition.

7. The composition of claim 1, wherein the at least one oxidizing agent comprises hydrogen peroxide or peracetic acid.

8. The composition of claim 1, wherein the at least one oxidizing agent is in an amount of from about 5 wt % to about 20 wt % of the composition.

9. The composition of claim 1, wherein the at least one organic acid or an anhydride thereof comprises acetic acid or acetic anhydride.

10. The composition of claim 1, wherein the at least one organic acid or an anhydride thereof is in an amount of from about 30 wt % to about 90 wt % of the composition.

11. The composition of claim 1, wherein the at least one hexafluorosilicate salt comprises ammonium hexafluorosilicate or a tetraalkylammonium hexafluorosilicate.

12. The composition of claim 1, wherein the at least one hexafluorosilicate salt is in an amount of from about 0.01 wt % to about 1 wt % of the composition.

13. The composition of claim 1, wherein the water is in an amount of from about 10 wt % to about 75 wt % of the composition.

14. The composition of claim 1, further comprising at least one organic solvent.

15. The composition of claim 14, wherein the at least one organic solvent comprises an alcohol or an alkylene glycol ether.

16. The composition of claim 15, wherein the at least one organic solvent comprises propylene glycol, hexylene glycol, 1,3-propanediol, or ethylene glycol butyl ether.

17. The composition of claim 14, wherein the at least one organic solvent is in an amount of from about 10 wt % to about 40 wt % of the composition.

18. The composition of claim 1, further comprising at least one inorganic acid.

19. The composition of claim 18, wherein the at least one inorganic acid comprises sulfuric acid or boric acid.

20. The composition of claim 18, wherein the at least one inorganic acid is in an amount of from about 0.1 wt % to about 5 wt % of the composition.

21. The composition of claim 1, wherein the composition has a pH of 1-3.

22. The composition of claim 1, wherein
the at least one fluorine-containing acid comprises hydrofluoric acid and is in an amount of from about 0.05 wt % to about 0.5 wt % of the composition;
the at least one oxidizing agent is in an amount of from about 5 wt % to about 10 wt % of the composition;
the at least one organic acid or an anhydride thereof is in an amount of from about 50 wt % to about 80 wt % of the composition;
the at least one polymerized naphthalene sulfonic acid is in an amount of from about 0.005 wt % to about 0.1 wt % of the composition;
the at least one hexafluorosilicate salt is in an amount of from about 0.01 wt % to about 1 wt % of the composition;
the at least one amine is in an amount of from about 0.001 wt % to about 0.1 wt % of the composition.

23. The composition of claim 22, wherein the at least one oxidizing agent is from about 6 wt % to about 10 wt % of the composition.

24. The composition of claim 22, wherein the at least one organic acid or an anhydride thereof is from about 60 wt % to about 80 wt % of the composition.

25. The composition of claim 22, wherein the at least one polymerized naphthalene sulfonic acid is from about 0.005 wt % to about 0.05 wt % of the composition.

26. The composition of claim 22, wherein the at least one hexafluorosilicate salt is from about 0.05 wt % to about 0.5 wt % of the composition.

27. The composition of claim 22, wherein the at least one amine is from about 0.005 wt % to about 0.05 wt % of the composition.

28. The composition of claim 22, further comprising an inorganic acid.

29. The composition of claim 28, wherein the at least one inorganic acid comprises sulfuric acid.

30. The composition of claim 28, wherein the at least one inorganic acid is in an amount of from about 0.1 wt % to about 5 wt % of the composition.

31. The composition of claim 1, wherein the composition comprises:
hydrofluoric acid;
hydrogen peroxide;
acetic acid;
a sulfonic acid having a structure of

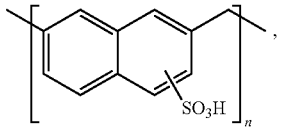

in which n is 3 to 6;

N-(3-aminopropyl)-diethanolamine;
sulfuric acid;
ammonium hexafluorosilicate; and
water.

32. The composition of claim 31, wherein the composition comprises:
hydrofluoric acid in an amount of from about 0.05 wt % to about 0.5 wt % of the composition;
hydrogen peroxide in an amount of from about 5 wt % to about 10 wt % of the composition;
acetic acid in an amount of from about 50 wt % to about 80 wt % of the composition;
a sulfonic acid having a structure of

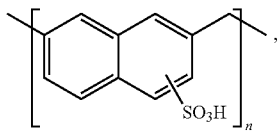

in which n is 3 to 6, the sulfonic acid being in an amount of from about 0.005 wt % to about 0.1 wt % of the composition;

N-(3-aminopropyl)-diethanolamine in an amount of from about 0.001 wt % to about 0.1 wt % of the composition;
sulfuric acid in an amount of from about 0.1 wt % to about 5 wt % of the composition;
ammonium hexafluorosilicate in an amount of from about 0.01 wt % to about 1 wt % of the composition; and
water.

33. A method, comprising:
contacting a semiconductor substrate containing a SiGe film with a composition of claim 1 to substantially remove the SiGe film.

34. The method of claim 33, wherein the SiGe film comprises from about 10 wt % to about 25 wt % Ge.

35. The method of claim 33, further comprising rinsing the semiconductor substrate with a rinse solvent after the contacting step.

36. The method of claim 33, further comprising drying the semiconductor substrate after the rinsing step.

37. The method of claim 33, wherein the method does not substantially remove SiN, poly-Si, or SiCO.

* * * * *